(12) United States Patent
Kreft

(10) Patent No.: US 6,565,007 B1
(45) Date of Patent: May 20, 2003

(54) CHIP CARD WITH AN ELECTRONIC BLOCKING FUNCTION

(75) Inventor: Hans-Diedrich Kreft, Dassendorf (DE)

(73) Assignee: Angewandte Digital Elektronik, Dassendorf (DE)

( * ) Notice: Subject to any disclaimer, the term of this patent is extended or adjusted under 35 U.S.C. 154(b) by 0 days.

(21) Appl. No.: 09/673,553

(22) PCT Filed: Apr. 14, 1999

(86) PCT No.: PCT/EP99/02516

§ 371 (c)(1),
(2), (4) Date: Feb. 26, 2001

(87) PCT Pub. No.: WO99/53426

PCT Pub. Date: Oct. 21, 1999

(30) Foreign Application Priority Data

Apr. 14, 1998 (DE) ............................ 198 16 417

(51) Int. Cl.$^7$ .............................................. G06K 19/06
(52) U.S. Cl. ...................................... 235/492; 235/1.51
(58) Field of Search ................................ 235/492, 487, 235/441, 451

(56) References Cited

U.S. PATENT DOCUMENTS

| | | | |
|---|---|---|---|
| 4,791,285 A | * 12/1988 | Ohki | ........................ 235/492 |
| 4,894,522 A | * 1/1990 | Elliott | ................... 235/472.01 |
| 4,960,983 A | * 10/1990 | Inoue | ......................... 235/449 |
| 5,206,495 A | 4/1993 | Kreft | |
| 5,875,450 A | 2/1999 | Reiner et al. | |
| 6,132,799 A | * 10/2000 | Corniglion et al. | ........... 427/96 |
| 6,142,381 A | * 11/2000 | Finn et al. | .................. 235/492 |

FOREIGN PATENT DOCUMENTS

| | | |
|---|---|---|
| DE | 3935364 | 8/1990 |
| DE | 196 04 04544 | 8/1997 |

* cited by examiner

*Primary Examiner*—Daniel St. Cyr
(74) *Attorney, Agent, or Firm*—Sonnenschein Nath & Rosenthal

(57) ABSTRACT

The invention relates to a circuit for a chip card, characterized by an active function, which deactivates other function by interrupting the electrical connections. The chip card has two switching elements and two different transmission circuits for exchanging energy and data bi-directionally to an outside location, wherein the transmission circuits are set in a first and a second active function so that when the first active function of the chip card establishes communication, the second active function of the chip card is made inactive.

6 Claims, 2 Drawing Sheets

Figur 1

CHIP CARD WITH AN ELECTRONIC BLOCKING FUNCTION

BACKGROUND OF THE INVENTION

The invention relates to a chip card with a semiconductor chip, in which for the energizing of the chip and for the bidirectional data transmission by means of a terminal from and to the chip, first transmission means are provided, such as contacts and/or second transmission means, such as contact-free coils and/or capacitors, and/or other energy- and data-transmission means, there being provided on the chip a drivable function element.

With use of chip cards for the bidirectional data transmission it is required in many cases always to hold only one transmission path for data and/or energy in an active function and to cut off the other transmission paths from their connection to the outside. For example, a chip card which is active per contact connection should ensure that the contact-free connections to the outer world are cut off.

Through DE 39 35 364 as well as U.S. Pat. No. 5,206,495 its U.S. equivalent a chip card has become known which is capable of automatically determining its mode of functioning either over contacts or coils. For this the chip card contains a chip (part 2) in which the usual parts of a microcomputer, such as a computing mechanism and a storage element, are accommodated. To the chip there is connected on the one side a contact field with contacts according to ISO standard 7816. On the other side coils are connected to the chip, which serve for the transmission of energy and the bidirectional data flow. In the chip an electronic element is present, which makes possible the automatic switchover from coil function to contact function and conversely, so that the chip card, either contact-free or contact-encumbered, is capable of exchanging energy and data with writing/reading terminals. The chip part 2 consists of two essential function elements, namely a part 2.1—which performs in correspondence to the writing/reading terminal which brings about the switchover between contact field and coils—and a part 2.2 in which the remaining chip functions such as computing mechanism and storage response unit are located. In this part there are carried out those processes which are of importance for the user of such a chip card, such as debiting of amounts of money, storage of identification numbers, etc. These two parts 2.1 and 2.2 are connected with each other by means of lines A1, A2, A3 . . . which serve in the chip for the part 2.2 as input and output lines for the processing of the information in the computing mechanism of that part 2.2.

Through EP 534 559 A1 there has been proposed a chip card according to ISO standard 7816 and to provisional ISO standard 10536, which, contact-free or contact-encumbered, can exchange energy and data with writing/reading terminals. The data can be read out according to two different modes, either over long distance by means of low energy—in which case only a part of the integrated switching circuit is activated (energy sparing mode)—or there takes place an exchange of energy and data according to the standardized mode by means of the contacts. As further relevant publications there have become known: DE 43 10 334, PCT/IB 96/00518, DE 195 372, as well as DE 195 31 275.

An analysis of the possibilities of separating chip parts and a solution of the problems is to be derived from DE 197 52 695 "Electronic switching element for the blocking of electronic parts in a chip card."

Through DE-C-44 03 753 a combined chip card has become known which operates both contact-free and also contact-encumbered, the IC of which is embedded into a contact block which presents an additional protection and can be used as a sensitive switching element for electronic purposes. In particular, through the function as switching element, the electronic system can be switched on or off by a card user for purposes of remote transmission. Furthermore, the contact block can be exchanged.

Through DE-A-197 23 272 a chip card with a microcomputer unit has become known, which is connected with electrically conducting contact surfaces for the contact-encumbered data transfer, and which has a data storage component which is connected with an antenna for contactless data transfer. A control unit in dependence on a control level establishes a connection between an antenna and storage element or an antenna and microcomputer unit.

SUMMARY OF THE INVENTION

Underlying the invention is the problem of securely carrying out the electrical separation of connections of the chip card to the outer world, in dependence on a functional or operating mode of the card.

The chip card of the aforementioned category according to the invention consists in that:

1. the function element in dependence on a first or second function or on a first or second working mode of the semiconductor chip drives one of two switching elements (S1 or S2),
2. wherein the first function or working mode of the semiconductor chip is characterized by an energy and/or data exchange over the first transmission means,
3. wherein the second function or working mode is characterized by an energy and/or data exchange over the second transmission means,
4. wherein the first function is active, as it cuts off parts of, or the entire electrical connection of the data and/or energy exchange to maintain the second function of the card over the further transmission means, with the exception of the active function, and conversely.

According to the invention it is a matter of a chip card with a chip in which different drivable components, such as microprocessors and storage elements are contained. The most diverse means can serve for the energizing, and for bidirectional data transmission from and to the chip. There are possible and known contacts, as well as means for the contactless data transmission, in the form of coils or capacitors. There can also be provided other energy and data transmission means and/or means such as are present as electronic, miniaturized elements for the reception of sound or pressure or for the capacitive reception of electric signals in fingerprint sensors. On the chip there is provided a drivable function element which recognizes the particular functional state or mode, whether the chip card is to operate contact-encumbered or contactless. This function element can be a comparison member, for example a comparator or operation amplifier, according to the part 2.1.2 of DE-C-39 35 364.

The function element, in dependence on this first or second function or operating mode of the chip, triggers one of the switching elements S1 or S2. With the elements S1, S2 it is a matter of electronic parts or switching circuits which are suited for cutting off electric line connections, insofar as they have a voltage lying on their control input. The first function/mode of the semiconductor chip is characterized by an energy exchange and/or data exchange with the outside of the card (with parts that are not contained in the chip, such as, for example terminals) over the first means. The first means are those that mark the active state of the card. In a card this can be the connection over the contacts or over the coils. The second function/mode is characterized by an energy and/or data exchange over further means. If the first function is active, then parts of, or the entire electrical connection of the data and/or energy exchange should be cut off from the further or other functions of the card with the exception of the active function. The particular active function should cut off the possible other functions from any data exchange.

The function mode is to be described in the example of a chip card that contains both contacts and also coils for the energy and/or data exchange with the environment, as with a terminal. If data come in over the contacts, these data are worked up for further use in a part, as an entry port for transport over lines. The data arriving from the coils are worked up by a further part, as entry port, for transport over further lines. If now the function element perceives the activation of the chip card over the contacts or the coil, as, for example, the origin of the voltage, for example according to DE-C-39 35 364, then one of the switching elements S1 and S2 can be activated and the connection to outside the card can be cut off. In such manner, for example, the modulated-on signals that arrive over the coils, can be cut off before their demodulation, for the purpose of data recovery from the entry port, part 2.1.4.

It can happen that certain functions are activated within the same brief spans of time. In each case the dominant function which arises first in time over the time span, should block the others over the switching elements S1, S2.

In all cases in which other functions are already active, the function should serve the switching elements S1 or S2 over dominant contacts. Therewith a clear priority is to be established between the different possible active states.

If a card is activated over contacts or if it is activated during another function over contacts, the contacts represent the strongest energy supply (power supply). Also, the reference potential (VCC of the contacts) is stable with respect, for example, to contact-free reference potential, since it is connected with the potential in a terminal. If line connections or signal outputs or data lines from or to the further function parts are laid on the voltage base potential of the contact input, it is ensured that no other signal—namely no other data, signals, logical levels or energies—remain stable; they will adapt themselves to the reference potential. In this manner there is determined an electrical dominance of the contact function.

DESCRIPTION OF THE PREFERRED EMBODIMENTS

Figure 1:
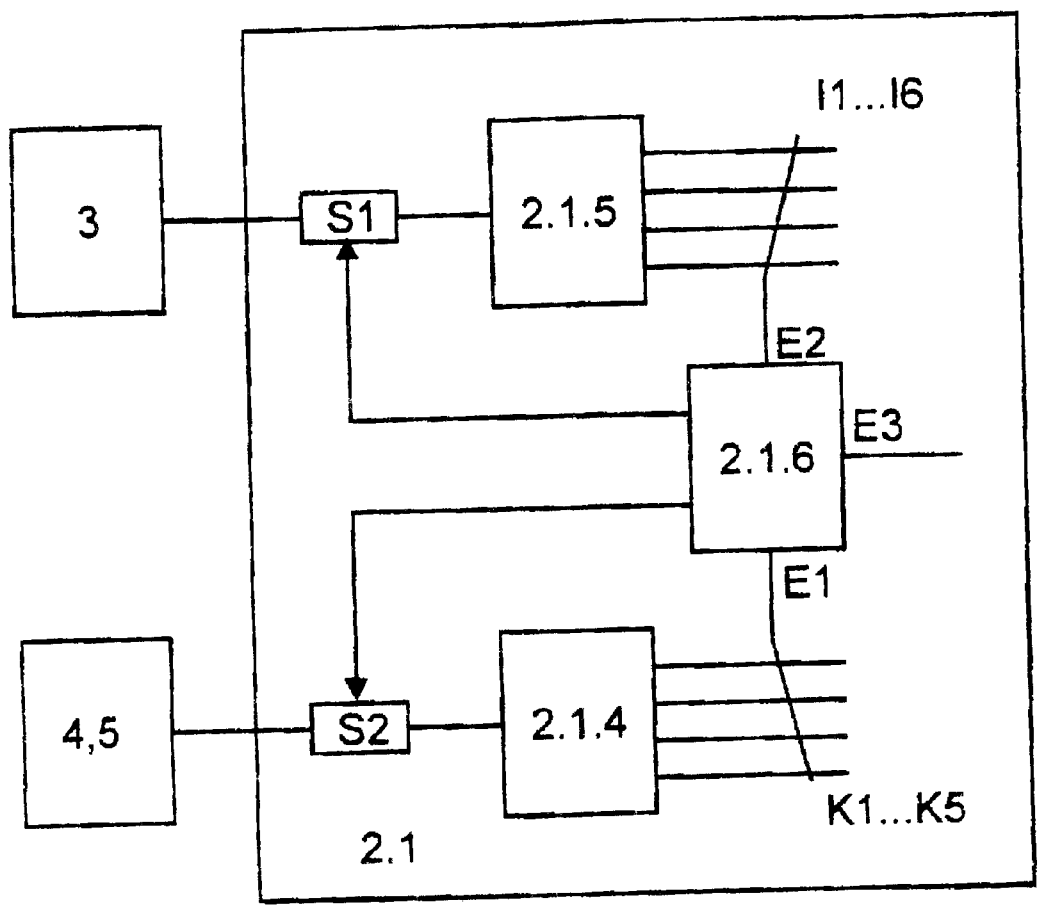
FIG. 1 is a circuit diagram for an embodiment of an execution of the invention.

A chip card according to FIG. 1 contains a contact field with contacts 3 of a contact connection, and coils 4, 5 or capacitors or other transmission elements of a contact-free connection for the contact-encumbered or contact-free exchange of data and/or energy between a chip card 1 and a writing/reading terminal (not shown). The chip(s) present in the chip card can be connected to the contacts 3, as well as to the coils 4, 5 and/or to capacitors and/or other transmission elements of a contact-free connection. According to the surrounding field of the chip card, i.e., according to the writing/reading terminal in which the chip card is located, energy and data are exchanged on the basis of the working mode determined by a function element 2.1.6 over contacts 3 or coils 4, 5 and/or capacitors and/or other transmission elements of a contact-free connection with the writing/reading terminal. The function element 2.1.6 corresponds to the part 2.1.2 in DE-C-39 35 364 incorporated herein by reference and acts with its output on a circuit 2.1.3 (FIG. 2), which can be a throw switch or a multiplexer. The outputs A1 . . . An of the circuit 2.1.3 make available an energy supply to further chip parts or to a farther chip or to several chips in a part 2.2 (FIG. 2), in which there are located the remaining chip functions, such as computing mechanism and storage units; the chip card in this manner fulfills its intended function, for example in contact-encumbered and/or in contactless mode of operation.

When data come in over the contacts 3, these are worked up for further use in a part 2.1.5 for transport over lines I1–I6. The data and/or energy coming in from the coils 4, 5 are worked up by a part 2.1.4 for transport over lines. K1 . . . K5. The parts 2.1.4 as well as 2.1.5 have, for example, entry ports or entry latches or entry gates for the suppression of voltage peaks or for the signal preparation.

In the contact connection of the lines I1 . . . I6 of the contacts 3 there lies a switching element $S_1$ for the cutting-off of the contact connection or of the lines I1 . . . I6, respectively, just as in the contact-free connection of the lines K1 . . . K5 of the coils 4, 5 and/or of the capacitors and/or of other transmission elements there lies a switching element S2 for the cutting-off of the contact-free connection or of the lines K1 . . . K5. If the function element part 2.1.6 recognizes the activation of the chip card either over the contacts 3 or over the coils 4, 5, as, for example, the voltage is recognized, for example according to DE-C-39 35 364, then either the switching element S1 or the switching element S2 can be activated, and the connection of the chip card to the outside, that follows it, can be cut off.

Figure 2:
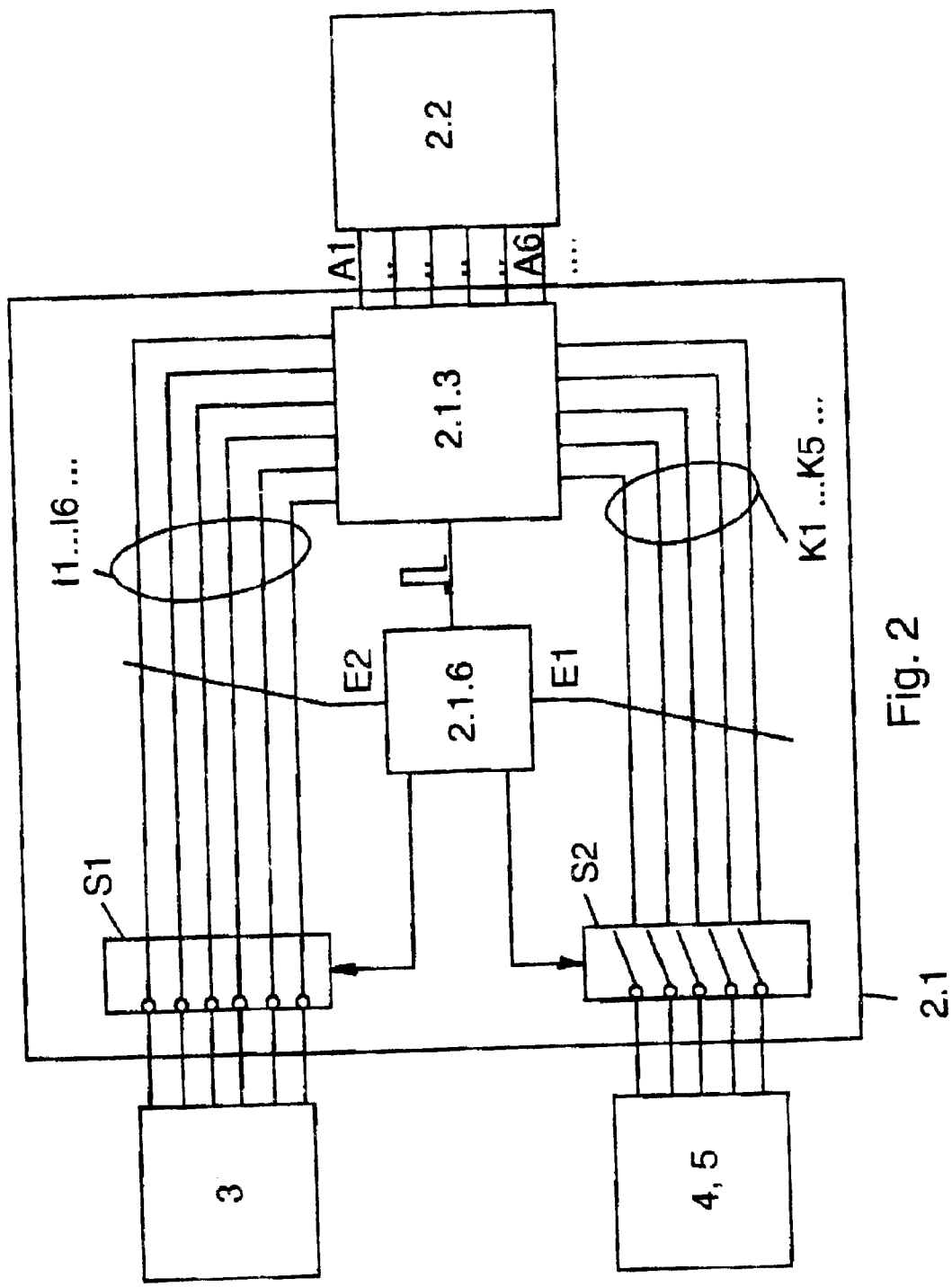
FIG. 2 is a further circuit diagram for the realization of the invention.

FIG. 2 shows a circuit diagram similar to FIG. 1. In a general manner, in a contact connection I1 . . . I6 of contacts 3 to a switching circuit 2.1.3, which according to DE-C-39 35 364 can be a throw switch or a multiplexer, there lies an electrical or electronic switching element S1. Likewise, in a contact connection K2 . . . K5 of coils 4, 5 and/or capacitors and/or other transmission elements to the switching circuit 2.1.3 there lies a switching element S2, in which arrangement the two switching elements S1, S2 which are represented symbolically as switches, cut off the corresponding contact connection on their respective triggering through the switching circuit 2.1.6. When function element 2.1.6 receives the report, over a connection or coupling E2, of the activation of the contact-encumbered connecting contact I1 . . . I6 then the switching element S2 is activated through the function element 2.1.6, and the contact connections K1 . . . K5 of coils 4, 5 and/or capacitors and/or other transmission elements to the switching circuit 2.1.3 are interrupted. Then no simultaneous manipulations can be carried out over the coils 4, 5 while the contacts are activated.

If, conversely, the function element 2.1.6 receives the report, over E1, of the activation of the contactless contact connections K1 . . . K5 then the switching element S1 is activated by the function element 2.1.6, and the contact connection I1 . . . I6 is cut off, so that over the contacts 3 no simultaneous manipulations can be carried out over the contacts 3, therefore while the coils 4, 5 are activated.

The invention is usable industrially to improve the security against manipulations, of chip cards which are capable of operating both contact-encumbered and also contact-free. The usefulness of the invention lies especially in that in this manner, however, further functions of the chip card in contrast are deactivated, as electrical connections are cut-off by an active function or by an active working mode of the chip card.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

What is claimed is:

1. A chip card with at least one semiconductor chip, wherein different transmission means are provided on the chip card for a supply of energy to the chip from an outside location and for bi-directional data transmission from and to the chip from the outside location, and on the chip there is also arranged a triggerable function element which is arranged to perceive an energy and/or data exchange between the chip card and the outside location over the different transmission means as a first and a second active function, the chip card further comprising two switching elements arranged such that when an electrical voltage is applied to them, are capable of cutting off electric line connections, wherein after perception by the triggerable function element of the first active function brought about by the energy and/or data exchange with one of the transmission means, the triggerable function element triggers one of the two switching elements, which one switching element blocks the energy and/or data exchange with the other transmission means, or after perception by the triggerable function element of the second active function, brought about by the energy and/or data exchange with one of the other transmission means, the function element triggers the other switching element, which other switching element blocks the energy and/or data exchange with the other transmission means, so that through a particular active function of the triggerable function element brought about by the energy and/or data exchange with one of the transmission means, the energy and/or data exchange with the other transmission means, with exception of one of the active functions, is blocked, in which case a function occurring first in time dominantly blocks the other active function over an allocated switching element and, any actuation of the chip card over contacts, line connections or signal outputs or data lines from and/or to further function parts of the chip card are laid on a voltage ground potential of a contact input, so that electrical dominance of a contact function is determined.

2. The chip card according to claim 1, wherein a function over contacts in all cases dominantly serves a connected one of the switching elements.

3. The chip card according to claim 1, wherein within a contact connection to a switching circuit, a first electronic switch element is provided, and within a connection of contract-free transmission elements to this switching circuit, there is arranged a second electronic switching element, wherein, in an activation of the contact connection, the function element activates the second electronic switching element, which blocks the contactfree connection, and conversely in the activation of the coils and/or capacitors and/or other transmission elements.

4. A chip card with at least one semiconductor chip comprising: a first transmission means on the chip card for a supply of energy to the chip from an outside location, and a second, different transmission means on the chip card for bi-directional data transmission from and to the chip from the outside location, a triggerable function element arranged on the chip to perceive an energy and data exchange between the chip card and the outside location over the different transmission means as a first and a second active function, the chip card further comprising two switching elements arranged such that when an electrical voltage is applied to the two switching elements, they are capable of cutting off electric line connections, wherein the triggerable function element is arranged such that after perception by the triggerable function element of the first active function brought about by the energy and/or data exchange with one of the transmission means, the triggerable function element triggers one of the two switching elements, which switching element is arranged to block the energy and/or data exchange with the other transmission means, or after perception by the triggerable function element of the second active function, brought about by the energy and/or data exchange with one of the other transmission means, the triggerable function element is arranged to trigger the other switching element, and the other switching element is arranged to block the energy and/or data exchange with the other transmission means, so that through a particular active function of the triggerable function element brought about by the energy and/or data exchange with one of the transmission means, the energy and/or data exchange with the other transmission means, with exception of one of the active functions, is blocked, in which case a function occurring first in time dominantly blocks the other function over an allocated switching element and, any actuation of the chip card over contacts, line connections or signal outputs or data lines from and/or to further function parts of the chip card are laid on a voltage ground potential of a contact input, so that an electrical dominance of a contact function is determined.

5. The chip card according to claim 4, arranged such that a function over contacts in all cases dominantly serves a connected one of the switching elements.

6. The chip card according to claim 4, arranged such that within a contact connection to a switching circuit, a first electronic switch element is provided, and within a connection of contract-free transmission elements to this switching circuit, there is arranged a second electronic switching element, wherein, in an activation of the contact connection, the function element activates the second electronic switching element, which blocks the contactfree connection, and conversely in the activation of the coils and/or capacitors and/or other transmission elements.

* * * * *